(12) United States Patent
Mertens et al.

(10) Patent No.: US 9,213,048 B2
(45) Date of Patent: Dec. 15, 2015

(54) SYSTEM AND METHOD FOR TESTING AN ELECTRONIC DEVICE

(75) Inventors: Robert Matthew Mertens, Champaign, IL (US); John Eric Kunz, Jr., Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 698 days.

(21) Appl. No.: 13/564,965

(22) Filed: Aug. 2, 2012

(65) Prior Publication Data

US 2014/0035608 A1 Feb. 6, 2014

(51) Int. Cl.
*G01R 31/20* (2006.01)
*G01R 1/18* (2006.01)
*G01R 31/00* (2006.01)
*G01R 1/067* (2006.01)

(52) U.S. Cl.
CPC ............... *G01R 1/18* (2013.01); *G01R 31/002* (2013.01); *G01R 1/06766* (2013.01); *G01R 1/06777* (2013.01); *G01R 1/06788* (2013.01)

(58) Field of Classification Search
None
See application file for complete search history.

(56) References Cited

U.S. PATENT DOCUMENTS

| 5,818,235 | A  | * | 10/1998 | Simonov et al. | 324/457 |
|-----------|-----|---|---------|----------------|---------|
| 6,894,479 | B2 | * | 5/2005  | Siefers et al. | 324/754.16 |
| 7,880,487 | B2 | * | 2/2011  | Petrick        | 324/754.07 |
| 2003/0137310 | A1 | * | 7/2003 | Holzel         | 324/537 |
| 2009/0134880 | A1 | * | 5/2009 | Grund          | 324/537 |

* cited by examiner

*Primary Examiner* — Minh N Tang
(74) *Attorney, Agent, or Firm* — Tuenlap D. Chan; Frank D. Cimino

(57) ABSTRACT

Adapters for electrostatic discharge probe tips are disclosed herein. An embodiment of the adapter includes an attachment device that is attachable to the tip of the probe. A first conductor is affixed to the attachment device so that the first conductor contacts the tip when the attachment device is attached to the tip of the probe. A second conductor extends between the first electrical conductor and a point external to the attachment device.

18 Claims, 2 Drawing Sheets

SYSTEM AND METHOD FOR TESTING AN ELECTRONIC DEVICE

BACKGROUND

Many electronic devices are susceptible to failure when they are subjected to an electrostatic discharge (ESD). The ESD is a high voltage pulse that is typically short in duration. When an electronic device receives an ESD, the energy of the discharge may destroy or degrade electronic components within the electronic device.

The effects of ESD are very unpredictable. Testing an electronic device for susceptibility to ESD involves subjecting a sample of the electronic device to simulated ESD pulses and then testing the electronic device to determine whether it has failed. The testing involves two steps. The first step involves connecting an ESD simulator to the electronic device and subjecting the electronic device to a simulated ESD pulse. The ESD simulator is then disconnected from the electronic device and test equipment is connected to the electronic device. The electronic device is then tested to determine whether it has failed, which determines whether the device can withstand ESD.

Connecting both the ESD simulator and the test equipment simultaneously to the electronic device presents several problems. One problem is that the simulated ESD pulse generated by the ESD simulator may damage the test equipment. Another problem is that the simulated ESD pulse is a very short, but high voltage signal. As such, it is very susceptible to loading that may occur by being connected to the test equipment. For example, internal capacitance in the test equipment or the leads of the test equipment may dampen the simulated ESD pulse to a point where the electronic device is not being subjected to the correct simulated ESD pulse.

Therefore, a need exists for simpler methods and devices for testing electronic devices. The methods and devices need to be quick, provide accurate simulated ESD pulses to the electronic devices, and leave the test equipment undamaged.

SUMMARY

Adapters for electrostatic discharge probe tips are disclosed herein. An embodiment of the adapter includes an attachment device that is attachable to the tip of the probe. A first conductor is affixed to the attachment device so that the first conductor contacts the tip when the attachment device is attached to the tip. A second conductor extends between the first electrical conductor and a point external to the attachment device.

DETAILED DESCRIPTION

Figure 1:
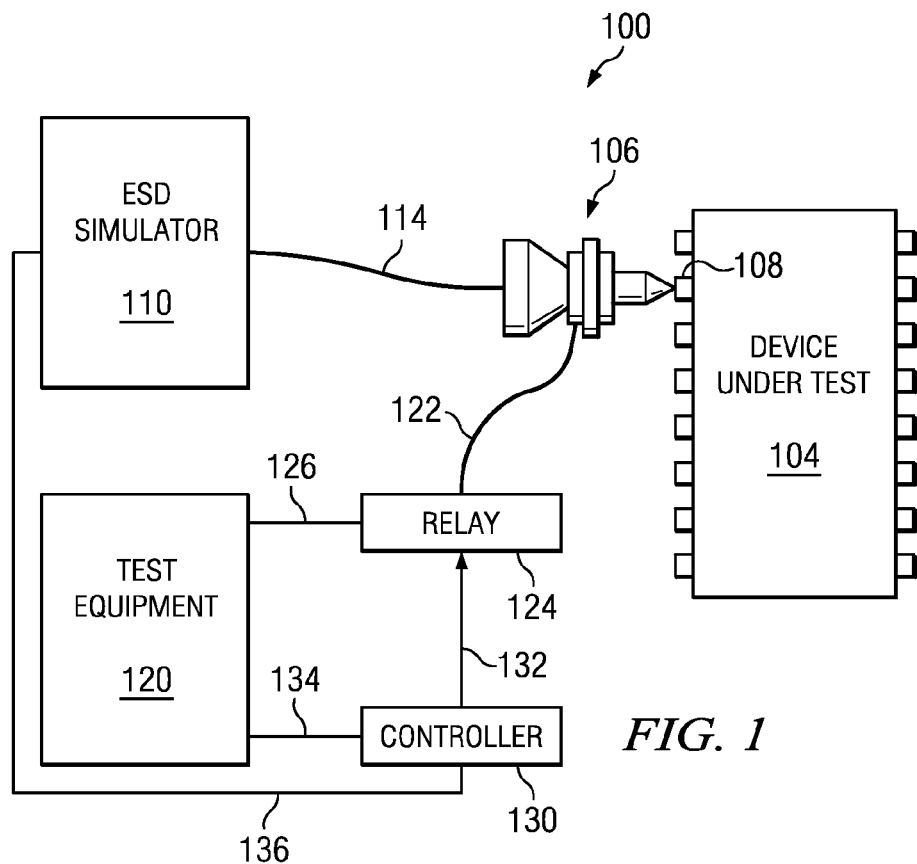
FIG. 1 is an embodiment of a schematic diagram of a test system to determine whether a device under test can withstand ESD.

A system 100 for testing a device under test 104 is shown in FIG. 1. In the embodiment of FIG. 1, the device under test 104 is an integrated circuit. However, the device under test 104 is not limited to integrated circuits and may be any electronic device. An ESD probe 106 is electrically contactable with a lead 108 of the device under test 104. An ESD simulator 110 is connected to the ESD probe 106 by way of a line 114. In some embodiments, the ESD simulator 110 and the ESD probe 106 are a single device, such as a hand-held device. In such devices, there is no line 114. The ESD simulator 110 generates an electrical signal that simulates an electrostatic discharge. For example, the ESD simulator may generate a simulated ESD pulse of a few thousand volts that has a duration of a few nanoseconds. The simulated ESD pulse is transmitted to the device under test 104 by way of the probe 106.

Test equipment 120 is electrically connectable to the probe 106 by way of a line 122, a relay 124, and another line 126. The relay 124 has an open state wherein the test equipment 120 is not electrically connected to the probe 106 and a closed state wherein the test equipment 120 is electrically connected to the probe 106. The relay 124 may be a switch that electrically connects and disconnects the test equipment 120 from the probe 106. The line 122 may be relatively short in order to electrically locate the relay 124 close to the probe 106. In doing so, the impedance of the line 122 will likely have little effect on the simulated ESD pulse emitted by the probe 106.

The test equipment 120 is used to test the functionality of the device under test 104. For example, the test equipment 120 may test the device under test 104 before and after the device under test 104 has been subjected to a simulated ESD pulse. In some embodiments, the test equipment 120 includes, oscilloscopes, spectrum analyzers, voltmeters, and ohmmeters. The test equipment 120 may only test the functionality of the device under test 104 related to the lead 108 to which the probe 106 is connected. Therefore, after the device under test 104 has been subjected to the simulated ESD pulse, the test equipment 120 may test the device under test 104 to make sure circuits connected to the lead 108 are functioning correctly. In other embodiments, the test equipment 120 may test more than just the components connected to the lead 108. In such embodiments, the simulated ESD pulse may cause damage to other circuits while the circuits tested on the lead 108 appear to function properly. Thus, the extended testing provided by the test equipment 120 may provide a complete test of the device under test 104.

A controller 130 is connected to the relay 124 by way of a line 132. The relay 124 has an open state wherein the line 122 is not connected to the line 126 and a closed state wherein the line 122 is connected to the line 126. In the embodiment of FIG. 1, the controller 130 controls the state of the relay 124. A voltage output to the relay 124 on the line 132 may cause the relay 124 to close and no voltage on the line 132 may cause the relay 124 to open. The controller 130 may also be connected to the test equipment 120 by a line 134 and the ESD simulator 110 by a line 136. As described in greater detail below, in some embodiments, the controller 130 may operate both the ESD simulator 110 and the test equipment 120. For example, the controller 130 may open the relay 124 when the ESD simulator 110 is active in order to prevent the test equipment 120 from being damaged or loading the simulated ESD pulse.

Figure 2:
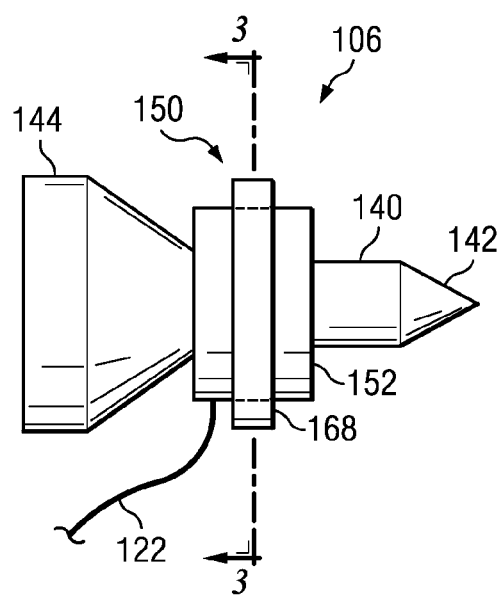
FIG. 2 is an enlarged schematic diagram of the test probe of FIG. 1.

Having described the test system 100, the probe 106 will now be described in greater detail. An enlarged view of the probe 106 is shown in FIG. 2. The probe 106 includes a conductive tip 140 that ends with a point 142. The point 142 is configured to contact specific electronic devices. For example, the point 142 of FIG. 2 is somewhat sharp and is able to contact the lead 108 on the device under test 104, FIG. 1. The tip 140 is attached to a holder 144. The holder 144 may be made of an insulating material so that a user may hold the holder 144 while operating the probe 106. The tip 140 and the holder 144 may be of the type used in conventional ESD simulator devices.

Figure 3:
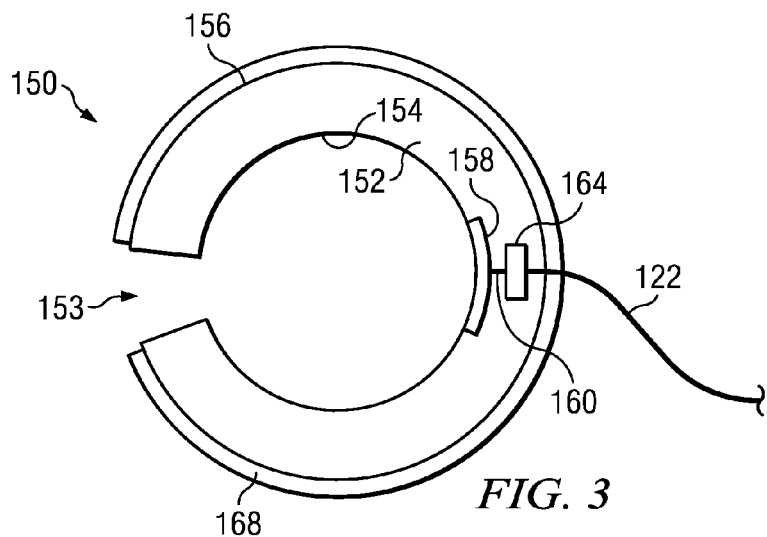
FIG. 3 is a cross sectional side view of an attachment mechanism of the test probe of FIG. 2.

The probe 106 includes a novel adapter 150 that contacts the tip 140. A cross sectional side view of the adapter 150 is shown in FIG. 3. The adapter 150 shown herein is made to fit over the tip of an existing probe, so there are no modifications that need to be made to a conventional ESD simulator in order to make the probe 106, other than adding the adapter 150 to the tip 140.

The adapter 150 includes an attachment device 152 that at least partially contacts the tip 140. The attachment device 152 has an inner surface 154 and an outer surface 156, wherein at least a portion of the inner surface 154 is adapted to contact the tip 140. A conductor 158, sometimes referred to as a first conductor, is located proximate the inner surface 154 so that it electrically contacts the tip 140 when the adapter 150 is located on the tip 140. The conductor 158 may have a shape that at least partially matches the outer surface of the tip 140 in order to form an electrical connection between the tip 140 and the conductor 158.

A line 160, sometimes referred to as a second conductor, electrically connects the conductor 158 to a point external to the attachment device 152, which in FIG. 3 is the line 122. It is noted that the first conductor 158 and the second conductor 160 are described as being separate components. However, it is to be understood that the first and second conductors 158, 160 may be a single conductor. A filter 164 may be connected to the line 160 in order to isolate the test equipment 120, FIG. 1, from the simulated ESD pulse. In the embodiment of FIG. 3, the filter 164 is a resistor that is connected in series with the line 160 so as to provide a resistance between the conductor 158 and the line 122. The resistor serves to filter or isolate the probe 106 from impedances associated with the adapter 150 and wires and devices connected to the adapter 150. The resistance within the device under test 104 when measured from the lead 108 may only be a few ohms. Therefore, a resistor 164 having a value of a few kilohms will typically suffice in preventing the adapter 150 from interfering with the simulated ESD pulse emitted by the tip 140.

The attachment device 152 may be made of an elastic material, such as a foam material. The attachment device 152 may also be C-shaped and may have an opening 153. The elastic material, along with the C-shape, enables the attachment device 152 to expand around the tip 140 and to fit snug against the tip 140. Accordingly, the attachment device 152 may be retained against the tip 140 by frictional forces between the attachment device 152 and the tip 140. The material of the attachment device 152 may be electrically insulating. The insulating material will cause fewer effects on the simulated ESD pulse that is emitted by the tip 140 than conductive materials. The use of an insulating material for the attachment device 152 also reduces the likelihood of a user being shocked while using the probe 106.

In some embodiments, the attachment device 152 may have a clamp 168 that further secures the attachment device 152 to the tip 140. The clamp 168 may be more rigid than the attachment device 152 and serves to further secure the attachment device 152 to the tip 140. The clamp 168 may be made of flexible material, such as plastic, and, like the attachment device 152, may be C-shaped.

Figure 4:
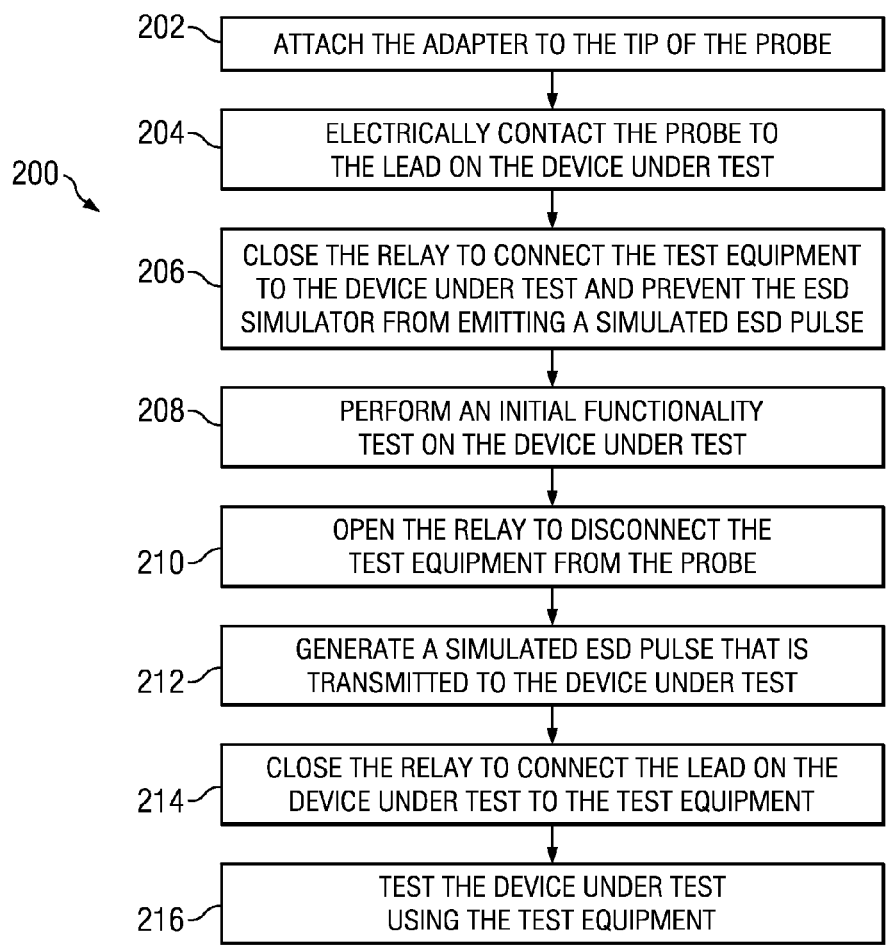
FIG. 4 is a flow chart describing an embodiment of the operation of the test system 100 of FIG. 1.

The operation of the test system 100 will be described with additional reference to the flow chart 200 of FIG. 4. The testing process commences with attaching the adapter 150 to the tip 140 of the probe 106 as described in step 202. The attachment device 152 may be expanded to fit over the tip 140 and secured in place with the clamp 168. The probe 106 may be a conventional probe used in ESD simulators, except for the addition of the adapter 150. At step 204, the tip 140 electrically contacts the lead 108 of the device under test 104. At this time, the controller 130 may close the relay 124 and prevent the ESD simulator 110 from emitting a simulated ESD pulse to the probe 106 as described at step 206. Accordingly, the test equipment 120 is electrically connected to the lead 108 of the device under test 104.

The controller 130 may initiate a preliminary test on the device under test 104 at step 208 to determine if the device under test 104 is functioning properly before commencing an ESD test. If the device under test 104 is not working properly, there is no need to perform the ESD test.

If the controller 130 determines that the device under test 104 is functioning properly, it will commence the ESD test. The ESD test commences with opening the relay 124 as shown at step 210. For example, the controller 130 may send a signal to the relay 124 causing it to open. Opening the relay 124 disconnects the test equipment 120 from the probe 106. Therefore, the test equipment will not affect the simulated ESD pulse. At step 212, the ESD simulator 110 generates a simulated ESD pulse that is transmitted to the lead 108 on the device under test 104 by way of the probe 106. For example, the controller 130 may send a signal to the ESD simulator 110 causing the ESD simulator 110 to generate a specific simulated ESD pulse.

At this point in the testing, the device under test 104 has been subjected to a simulated ESD pulse. The device under test 104 needs to be tested to make sure that it continues to function properly after being subjected to the simulated ESD pulse. At step 214, the relay is closed so that the lead 108 on the device under test 104 is connected to the test equipment 120. The controller 130 may send a signal to the relay 124 that causes the relay 124 to close. The test equipment 120 now tests the device under test 104 as described at step 216. The controller 130 may send a signal to the test equipment 120 causing it to perform specific tests on the device under test 104. The controller 130 can analyze the test results to determine if the device under test 104 is functioning properly after being subjected to the simulated ESD pulse.

The test system 100 has been described above using the controller 130. In some embodiments, the controller 130 is not required and a user of the test system 100 may manually perform the tests. For example, the user may open or close the relay 124. Likewise, the user may initiate tests using the test equipment 120 and may cause the ESD simulator 110 to generate the simulated ESD pulse.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. An adapter for an electrostatic discharge probe, the probe having a conductive tip that is connectable with a lead of a device under test, the adapter comprising:

an attachment device that is attachable to the tip of the probe, the attachment device including an inner surface structured to contact and snug around the tip when the attachment device is attached to the tip;

a first conductor affixed to a portion of the inner surface of the attachment device without completely covering the inner surface, the first conductor configured to contact the tip when the inner surface of the attachment device contacts and snugs around the tip; and a second conductor extending between the first conductor and a point external to the attachment device.

2. The adapter of claim 1, wherein the attachment device comprises an outer surface and wherein the second conductor extends between the first conductor and the outer surface.

3. The adapter of claim 1, wherein the attachment device comprises an elastic material that expands when the attachment device is placed on the tip and wherein the elastic material retains the adapter onto the tip by friction.

4. The adapter of claim 1, wherein the attachment device has the inner surface that is contoured at least partially to the surface of the tip.

5. The adapter of claim 1, wherein the attachment device is C-shaped and made from an elastic material, and wherein the attachment device is expandable to fit over the tip.

6. The adapter of claim 1 and further comprising a filter electrically connected to the first conductor.

7. The adapter of claim 6, wherein the filter is a resistor connected in series with the second conductor.

8. The adapter of claim 6, wherein the filter is located in the attachment device.

9. A system for testing a device under test, the system comprising:
 an electrostatic discharge simulator;
 a probe configured to establish an electrical connection with the electrostatic discharge simulator, the probe having a tip structured to contact the device under test;
 an adapter electrically connectable to the tip;
 a switch electrically connectable to the adapter without interfering with the connection established between the probe and the electrostatic discharge simulator; and
 test equipment electrically connectable to the switch, the test equipment electrically connected to the adapter when the switch is closed, and the test equipment disconnected from the adapter when the switch is open.

10. The system of claim 9 and further comprising a filter located between the tip and the test equipment.

11. The system of claim 10, wherein the filter is located in the adapter.

12. The system of claim 10, wherein the filter is a resistor.

13. The system of claim 9 and further comprising a controller connected to the switch, wherein the controller sets the open or closed state of the switch.

14. The system of claim 9, wherein the adapter comprises:
 an attachment device that is attachable to the tip of the probe;
 a first conductor affixed to the attachment device, wherein the first conductor contacts the tip when the attachment device is attached to the tip; and
 a second conductor extending between the first electrical conductor and a point external to the attachment device.

15. The system of claim 14, wherein the attachment device comprises an inner surface that contacts the tip when the attachment device is attached to the tip, and wherein the first conductor is located adjacent the inner surface.

16. A method for testing a device under test, the method comprising:
 disconnecting test equipment from a tip of a probe connected to an electrostatic discharge (ESD) simulator by opening a switch disposed between the probe and the test equipment;
 contacting the tip to a lead on the device under test;
 transmitting a simulated ESD pulse from the ESD simulator to the device under test via the tip;
 upon the transmitting is completed, connecting the test equipment to the tip of the probe by closing the switch without disconnecting the probe from the ESD simulator; and
 testing the device under test using the test equipment.

17. The method of claim 16 and further comprising attaching an adapter to the tip, wherein the test equipment is connected to the adapter.

18. The method of claim 16, and further comprising closing the switch and testing the device under test prior to transmitting the simulated ESD pulse to the device under test.

* * * * *